United States Patent
Grittke et al.

(10) Patent No.: US 8,274,295 B2
(45) Date of Patent: Sep. 25, 2012

(54) METHOD FOR TESTING AN ELECTRONICS UNIT

(75) Inventors: Udo Grittke, Steinen (DE); Axel Humpert, Rheinau (DE); Dietmar Frühauf, Lörrach (DE); Harald Schäuble, Lörrach (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 376 days.

(21) Appl. No.: 12/311,247

(22) PCT Filed: Oct. 2, 2007

(86) PCT No.: PCT/EP2007/060481
§ 371 (c)(1), (2), (4) Date: Feb. 25, 2010

(87) PCT Pub. No.: WO2008/040744
PCT Pub. Date: Apr. 10, 2008

(65) Prior Publication Data
US 2010/0164506 A1  Jul. 1, 2010

(30) Foreign Application Priority Data
Oct. 4, 2006 (DE) .......................... 10 2006 047 262

(51) Int. Cl.
*G01R 31/02* (2006.01)
(52) U.S. Cl. .................................. 324/537; 324/555
(58) Field of Classification Search .................... 324/537
See application file for complete search history.

(56) References Cited

U.S. PATENT DOCUMENTS

| | | | | |
|---|---|---|---|---|
| 5,210,704 A | * | 5/1993 | Husseiny | 702/34 |
| 5,481,200 A | * | 1/1996 | Voegele et al. | 324/718 |
| 5,500,940 A | * | 3/1996 | Skeie | 714/25 |
| 5,504,432 A | | 4/1996 | Chandler | |
| 5,528,600 A | | 6/1996 | El Ayat | |
| 5,940,290 A | * | 8/1999 | Dixon | 700/9 |
| 6,075,724 A | * | 6/2000 | Li et al. | 365/185.18 |
| 6,133,952 A | | 10/2000 | Tewinkle | |
| 6,970,003 B2 | * | 11/2005 | Rome et al. | 324/718 |
| 7,222,048 B2 | * | 5/2007 | Petchenev et al. | 702/182 |
| 2002/0121910 A1 | | 9/2002 | Rome | |

FOREIGN PATENT DOCUMENTS

| | | |
|---|---|---|
| DE | 30 20 620 | 12/1981 |
| DE | 102 44 131 | 4/2004 |
| DE | 103 13 264 | 10/2004 |
| EP | 0 299 338 | 1/1989 |
| WO | WO 2005/036290 | 4/2005 |
| WO | WO 2008/040744 | 4/2008 |

* cited by examiner

*Primary Examiner* — Timothy J Dole
(74) *Attorney, Agent, or Firm* — Bacon & Thomas, PLLC

(57) ABSTRACT

A method for testing an electronics unit, especially an electronics unit of an apparatus for ascertaining and/or monitoring a process variable, wherein the electronics unit has a plurality of electrical components. At least a part of the electrical components is grouped into at least one group, and this group is supplied with a query signal. A response signal is received from the group, and the response signal is evaluated. Furthermore, the invention relates to an apparatus for determining and/or monitoring a process variable.

9 Claims, 2 Drawing Sheets

METHOD FOR TESTING AN ELECTRONICS UNIT

TECHNICAL FIELD

The invention relates to a method for testing an electronics unit, especially an electronics unit of an apparatus for ascertaining and/or monitoring a process variable, wherein the electronics unit includes a plurality of electrical components. Furthermore, the invention relates to an apparatus for determining and/or monitoring at least one process variable, wherein the apparatus includes at least one sensor element, and at least one electronics unit, wherein the electronics unit includes a plurality of electrical components.

BACKGROUND DISCUSSION

In process automation technology, measuring devices are often applied, which serve for registering or monitoring different measurement- or process-variables. The measuring devices are composed, in such case, usually, of: a sensor element, which produces a measurement signal, which is dependent on the process variable or on a change of the process variable; and an electronics unit. The term "electronics unit" of a measuring device or a corresponding apparatus for determining and/or monitoring a process variable is meant to include, in the following, all the components participating in the operating of the sensor element and/or in the processing of the measurement signals, i.e. the electronics unit includes both the operating electronics, as well as also the measurement transmitter. Examples of process variables include: fill-level, viscosity, density, pressure difference, pressure, flow, e.g. flow rate, mass flow, temperature, pH-value, redox potential and oxygen content.

Located in the electronics unit are, in such case, for example, circuits for signal conditioning, such as involve, most often, analog components mounted on a circuit board.

In the manufacture of such an electronics unit populating errors are possible, such including, for example, use of an incorrect component, a missing component, a component installed in a wrong position, an open, or short, circuit, a cold solder joint, and the like. In order to exclude these errors, usually, in the production of populated circuit boards, so-called test points are measured. Depending on the complexity of the circuits, a very large number of test points can be provided. These test points have, on the one hand, the disadvantage, that they decrease the available space on the circuit board, and, on the other hand, the read-out of such a large number of test signals is complicated and, thus, costly. A further problem in the case of a number of components is that they age quickly with time or due to extreme operating- and process-conditions (e.g. temperature jumps or very extreme temperatures) and, thus, on occasion, stop working. For this reason, regular reviews are provided, which can be optimized in the context of predictive maintenance programs.

SUMMARY OF THE INVENTION

An object of the invention is, thus, to simplify the checking of components. A further object is to provide a measuring device, which makes use of predictive maintenance for its components.

The invention includes a method for testing an electronics unit, wherein the electronics unit has a plurality of electrical components, wherein at least a part of the electrical components are grouped into at least one group, wherein a query signal is supplied to the group, wherein a response signal is received from the group, and wherein the response signal is evaluated. The group of components includes, in such case, at least two components. In an additional embodiment, there are at least two groups. Advantageously, there is, moreover, in the case, where there are only two components, no other components between these two components, i.e. they are directly connected with one another. Alternatively, a suitable connection is manufactured for the test, in order to be able to measure the group suitably. The number of components depends on the kind of group formation. For the test, any suitable query signal is supplied, as stimulus, to the group, or to the groups, when a plurality of groups has been constituted. Then, a response signal is received from the group or measured. The response can be, for example, a step response. Depending on embodiment of the electronics unit, a number of groups can be formed.

On occasion, particular, components may belong to more than one group. In such case, then response signals from the individual groups are measured and suitably evaluated. The method finds, in such case, application in the manufacture of the electronics unit or of the measuring device, or, when the device has been placed into an application, as a part of monitoring or as a part of predictive maintenance. The method has, thus, the advantage, that maintenance intervals can be determined on a needs basis. Furthermore, also availability of a process plant can be increased. Testing of the electronics unit is accomplished, in such case, either at the same time as the electronics unit is performing the tasks for which it was built, or in special test phases. The electronics unit is, in an embodiment, a component of a measuring device of process- and automation-technology. The function of the electronics unit is then, in this embodiment, the performing of the measuring.

An embodiment of the method of the invention provides that the response signal is compared with a desired value. For the circuit or for the particular group, a desired value, on occasion along with a tolerance band, is furnished for this. If the measured value deviates from this desired value, then such is, for example, indicated in the form of an alarm, or, from the degree of the deviation, a statement is provided concerning future development, i.e., e.g., a user-adjustable warning is produced.

Another embodiment of the method of the invention includes, that, from the comparison of the response signal with the desired value, a prediction is made concerning future behavior of the components of the group, from which the response signal was received. In this embodiment, thus, quite concretely, the measured value is used for prediction concerning the future to be expected for the components of the particular group. In an embodiment, the test-method is performed at least two points in time and the measured or received response signals are stored in a memory as historical data. From time behavior, or time development, of the data, it is calculated, when a replacement of the group may be required or when a detailed examination of the electronics unit or the measuring device will be required. For this, corresponding algorithms and data are furnished. The desired-value results, thus, from a response signal measured in a preceding test phase.

Another embodiment of the method of the invention provides that, by comparison of the response signal with the desired value, a prediction is made concerning expected lifetime of the components of the group, from which the response signal was received.

Another embodiment includes, that voltage drop across the group is measured, and that the measured voltage drop is evaluated. In this embodiment, thus, the response signal is a voltage drop. For this particular response signal, the aforementioned method steps of evaluation also hold correspondingly. The voltage drop is, in such case, either directly measured, or a possibly present, electrical current is suitably converted. Measuring of voltage drop is advantageous, because then, for example, an analog-digital converter can be applied, in order to allow the measurement data to be evaluated in a microprocessor.

The following embodiments are concerned with the types of groupings of the components.

An embodiment of the method of the invention includes that the group is formed according to failure rate of the components. For a number of components (resistances, capacitors, operational amplifiers, processors, etc.), data exists as regards life expectancy. I.e., starting from a circuit diagram of the electronics unit and the relevant data, which are, for example, furnished in the form of a database (examples include databases of Siemens, British Telecom, Military Handbook MIL-HDBK-217), those components can be identified, which have a higher failure rate. The groups are then formed on the basis of such components.

Another embodiment of the method of the invention provides that the group is formed according to function of the components in the electronics unit. Thus, one distinguishes between, for example, the regions, preamplification, signal filtering, phase shifting, signal conversion for bus communication, etc. Each of these functional units then forms its own group. Or, the other way around: The components of the individual groups differ with respect to their functional tasks within the electronics unit, their life expectancies or their influence on the response signal as a reaction of the group to the query signal. Especially, functional grouping is possible on the basis of a circuit diagram. The groupings can, in such case, be equal or different, as a function of whether the test method of the invention is being used in the case of manufacture or in the context of predictive maintenance. In the case of manufacture, the groupings can, for example, be done on the basis of components, such as diodes, which can be installed in wrong positions.

Another embodiment of the method of the invention includes that at least the measuring of the voltage drop is done with at least one analog-digital converter, which is not used for the function of the electronics unit. The analog-digital converter is, in an embodiment, a part of a microprocessor, which is arranged in the electronics unit. If the electronics unit is, for example, a component of a measuring device, then its function is the performing of the measuring.

Another embodiment of the method of the invention provides, that the group is modified and/or expanded in such a manner, that a change of at least one component of the group leads to a change of the response signal receivable from the group. This embodiment, thus, includes the idea of changing or expanding the group by including additional components provided for this purpose, such that aging of a component leads to a change of the response signal. I.e. the changing of one or more components is transformed into the range of measurability by the response signal. This embodiment relates, especially, to the measuring of voltage drop as response signal.

The invention achieves the noted object furthermore by an apparatus for ascertaining and/or monitoring at least one process variable. The apparatus includes: At least one sensor element, and at least one electronics unit, wherein the electronics unit includes at least a plurality of electrical components, wherein at least one control unit is provided, which is embodied in such a manner, that the control unit supplies at least one group of at least one part of the components with a query signal, that the control unit receives from the group a response signal, and that the control unit evaluates the response signal with respect to changes of the components of the group. In the measuring device of the invention, thus, a group is formed from a part of the components of the electronics unit. Preferably, at least two groups are formed and each group has at least two components. The group is formed, for example, of especially aging-susceptible components, of especially important components or of as many components as possible. Individual variants for obtaining these groups are described above in the description of the method of the invention and are applicable likewise for the measuring device of the invention. A response signal received from the group of components after the supplying of a query signal thereto is measured and evaluated with respect to aging phenomena or other changes of the components of the group by comparing e.g. the measured value with stored data. In an embodiment, the electronics unit is embodied in such a manner, that it supplies the sensor element with an exciter signal, receives from the sensor element a measurement signal, and processes the measurement signal, e.g. evaluates the measurement signal with respect to the process variable. In an embodiment, the control unit is a microprocessor, which is embodied in such a manner, that the microprocessor evaluates the voltage drop across at least one group of at least one part of the components with respect to changes of the components of the group. The response signal is, thus, in this case, a voltage drop.

An embodiment of the apparatus of the invention provides, that at least one analog-digital converter is provided, which is free of the measuring tasks and via which the control unit receives the response signal. If the control unit is a microprocessor, then, in an embodiment, the analog-digital converter is a part of the microprocessor. The analog-digital converter is, in this embodiment, provided especially for the test method. In an alternative embodiment, the analog-digital converter serves also for the actual measuring of the process variable.

BRIEF DESCRIPTION OF THE DRAWINGS

The invention will now be explained in greater detail on the basis of the appended drawing, the figures of which show as follows.

DETAILED DISCUSSION

Figure 1:
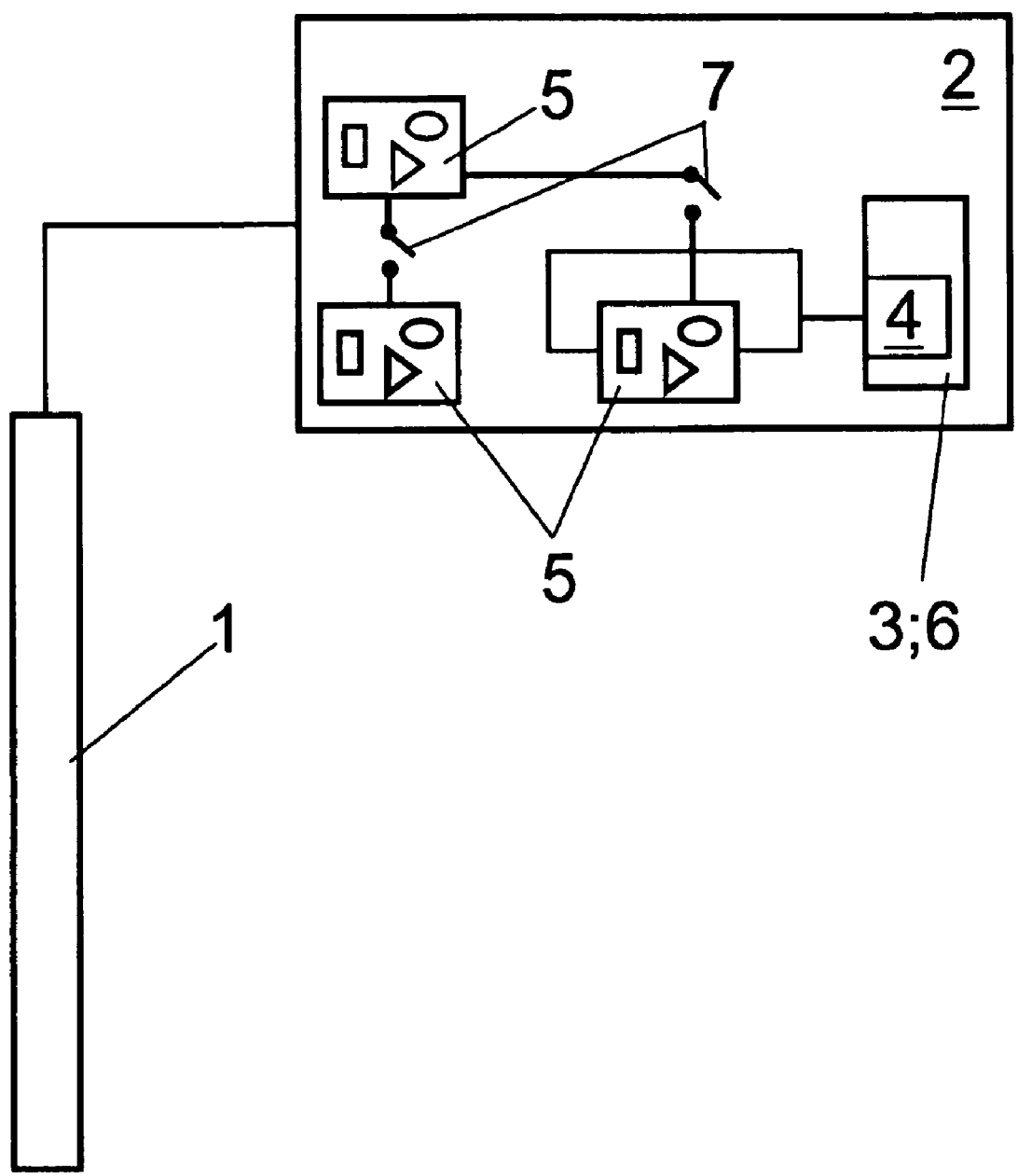
FIG. 1 a schematic drawing of an apparatus of the invention.

FIG. 1 shows, schematically, a capacitive measuring device. The sensor element 1 is, in such case, a rod, which is supplied from the electronics unit 2 with an electrical, alternating voltage as exciter signal. The sensor element 1 and a second probe (not shown) or the wall (not shown) of a container form, with a medium, whose fill-level, for example, is to be measured, as dielectric, a capacitor, whose capacitance is a measure for the fill-level of the medium.

Located in the electronics unit 2 is a plurality of components, whose properties (e.g. in the case of manufacture), or their change with time, are to be tested. According to the invention, the components are grouped into individual groups 5. The groups 5 relate, in such case, to locally adjoining components or to components remote from one another, e.g. to components mounted on a card or on a circuit board, which, for the group formation and, on occasion, also only for the test phases, are suitably electrically connected with one another.

The groups include, in such case, for example, predetermined test points, which are sensitive to the changes of a plurality of components, or to components, which are especially aging-susceptible (their on average expected failure point in time, for example, is smaller than the, on occasion, prescribed maintenance intervals) or to functional units within the electronics unit or to that combination of components, which so interact, that a change of the property of a component leads to a change of the voltage drop (such being here an example of the response signal) across such group 5. An option is to have the groups be supplemented by additional components, which serve especially for the testing and permit recognition of a change of a component on the basis of voltage drop. Shown are also two switch, or separating, elements 7, which separate for the test the individual component groups 5 from one another, so that the components are tested separately from one another and decoupled from the connections required for measurement operation. I.e., in normal measurement operation, these separating elements, or switches, 7 are closed. Furthermore, in an additional embodiment, switches are present within the groups 5 and are closed for the testing. Especially aging-susceptible components are, for example: Electrolytic capacitors (elcos), opto-couplers, power transistors or semiconductor sensors. Across these groups 5, in each case, the voltage drop is measured, which, via an analog-digital converter 4, is processed by the microprocessor. In an additional embodiment, the analog-digital converter 4 is connected with a multiplexer, so that the converter can be supplied with the voltage signals of the individual groups. For this, on occasion, also a special test signal is applied to the groups 5, in order, on occasion, to be able to perform also special measurements. The voltage drops across the individual groups 5 are then suitably evaluated in the microprocessor 6 (which, in this example, is serving as control unit 3) by, for example, comparison with desired values or with already stored, voltage drops of preceding test measurements. If there is, for example, a deviation larger than a predeterminable tolerance range, then, for example, a warning or an alarm is output. Simultaneously, in the case of a known behavior of the group 5 of components, starting from the measurements, it can be ascertained, when, with a high probability, a failure can be expected within the components of the groups. Thus, also maintenance intervals can be adapted to the concrete case and optimally specified. In such case, information is always only with regard to the entire group 5.

The method put into practice here in the measuring device includes, thus, steps as follows: Starting with the components of an electronics unit, such are first grouped. Examples for group formations are: Groupings of components, which together serve a shared function within the electronics unit; grouping of components, which, due to their properties or due to the environmental- or process-conditions, have a probability of failure lying within the operating time of the electronics unit; grouping of components, wherein an as much as possible large number of components is grouped in such a manner, that a change in any component affects the response. Each group is supplied with a query signal for the test and a response signal is measured. Involved, in such case, is, for example, voltage drop across the respective groups. The voltage measurement or the measuring of the response signal or the supplying with the query signal is accomplished, in such case, preferably with components, which are free of the actual function of the electronics unit, and which, thus, in the case, that the electronics unit is a part of a measuring device, are not used for the measuring per se. The measured response signal or the voltage drop is then appropriately evaluated e.g. with a microprocessor.

Figure 2:
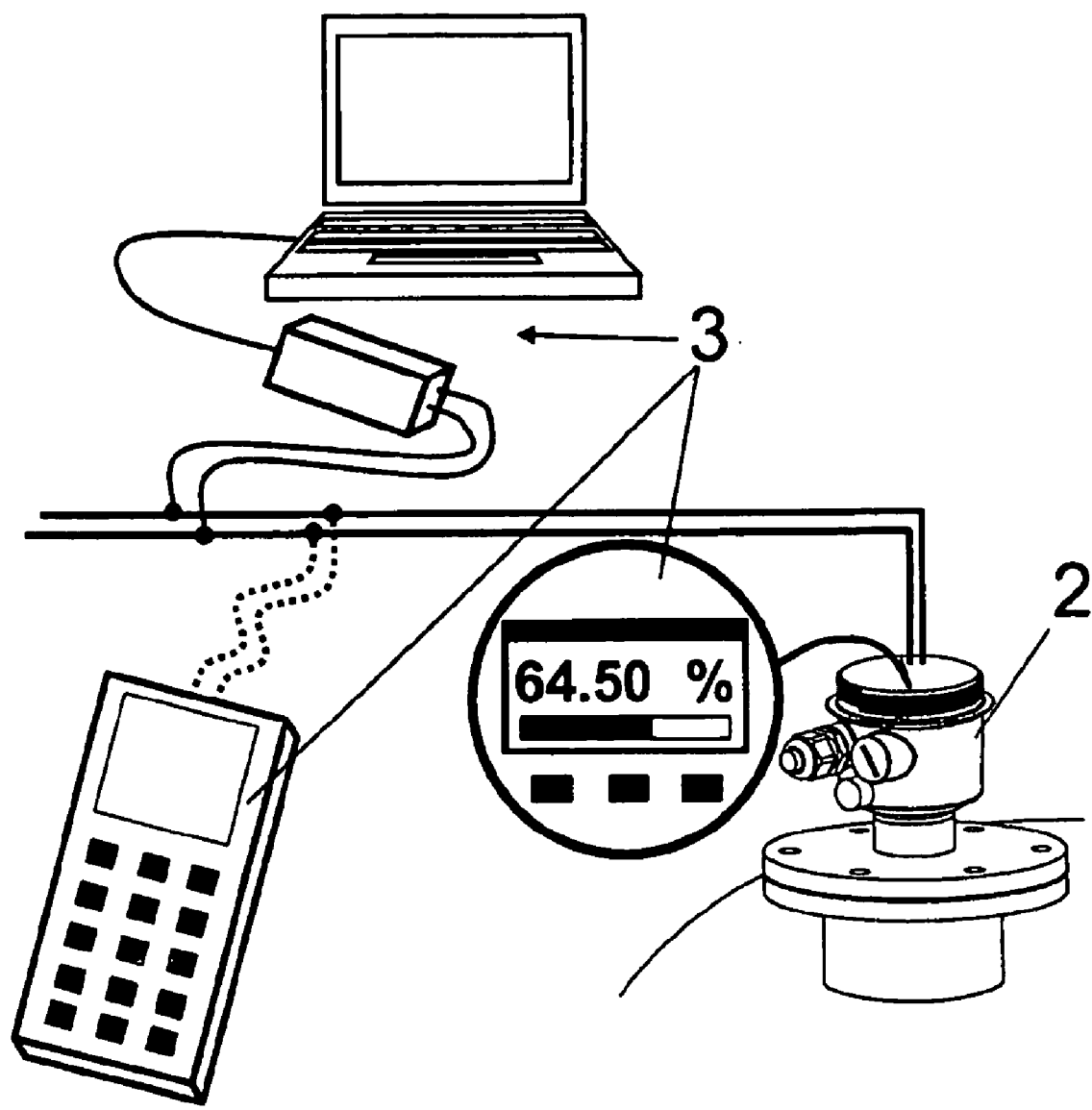
FIG. 2 a schematic drawing of use of a measuring device of the invention in a process plant.

FIG. 2 shows in which system surroundings the method of the invention can be put into practice, or which control units 3 can communicate with the measuring device of the invention. As illustrated here, the measuring device is secured to a container and the electronics unit 2 is located outside of the process. The electronics unit 2 is connected directly with a display- and servicing-module, or via a data bus, e.g. HART, Fieldbus-Foundation, with a servicing device appropriate for the fieldbus, or via a communication unit with a laptop as part of a control facility. Via these examples of control units 3, the testing of the individual groups is performed and, for example, appropriate maintenance intervals are established in correspondence therewith. There are, thus, the options, that the control unit 3 is a part of the measuring device and the tests performed on-site, or a superordinated unit is provided, which is brought into connection for testing and acts, for example, directly on the measuring device or loads suitable software into the device, in order that the test can be performed there.

The invention claimed is:

1. A method for testing an electronics unit of an apparatus for ascertaining and/or monitoring a process variable, said electronics unit having a plurality of electrical components, said method comprising the steps of:
   grouping at least one part of the electrical components into at least one group;
   supplying a query signal to the group;
   receiving a response signal from the group; and
   evaluating the response signal by comparing a measured value of the response signal with a desired value, thereby making a prediction concerning future behavior of the components of the group, from which the response signal was received, wherein:
   the testing is carried out when the apparatus has been placed in an application as part of monitoring or as a part of predictive maintenance.

2. The method as claimed in claim 1, wherein:
   by the comparison of the response signal with the desired value, a prediction is made concerning expected lifetime of the components of the group, from which the response signal was received.

3. The method as claimed in claim 1, further comprising the steps of:
   measuring a voltage drop across the group; and
   as a result evaluating the measured voltage drop.

4. The method as claimed in claim 3, wherein:
   at least the measuring of the voltage drop is done with at least one analog-digital converter, which is not used for a function of the electronics unit.

5. The method as claimed in claim 1, wherein:
   the group is formed according to failure rate of components.

6. The method as claimed in claim 1, wherein:
   the group is formed according to function of components in the electronics unit.

7. The method as claimed in claim 1, wherein:
   the group is modified and/or expanded in such a manner, that a change of at least one component of the group leads to a change of the response signal receivable from the group.

8. An apparatus for ascertaining and/or monitoring at least one process variable, comprising:
   at least one sensor element;
   at least one electronics unit; and
   at least one control unit, wherein:
   said electronics unit includes a plurality of electrical components;

said at least one control unit is embodied in such a manner, that when the apparatus has been placed in an application, as a part of monitoring or as a part of predictive maintenance it supplies at least one group of at least a part of the components with a query signal, and receives a response signal from the group; and said at least one control unit evaluates the response signal by comparing a measured value of the response signal with a desired value, thereby making a prediction concerning future behavior of the components of the group from which it received the response signal.

9. The apparatus as claimed in claim 8, further comprising:
at least one analog-digital converter, which is free of measuring tasks and via which said control unit receives the response signal.

* * * * *